US009058901B2

(12) United States Patent
Yoon

(10) Patent No.: US 9,058,901 B2
(45) Date of Patent: Jun. 16, 2015

(54) SEMICONDUCTOR APPARATUS WITH BOUNDARY SCAN TEST CIRCUIT

(71) Applicant: SK hynix Inc., Icheon-si Gyeonggi-do (KR)

(72) Inventor: Young Jun Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 225 days.

(21) Appl. No.: 13/846,157

(22) Filed: Mar. 18, 2013

(65) Prior Publication Data

US 2014/0176168 A1    Jun. 26, 2014

(30) Foreign Application Priority Data

Dec. 24, 2012   (KR) .......................... 10-2012-0151783

(51) Int. Cl.
*G01R 31/3185* (2006.01)
*G11C 29/12* (2006.01)
*G01R 31/317* (2006.01)
*G11C 29/32* (2006.01)

(52) U.S. Cl.
CPC .. *G11C 29/12015* (2013.01); *G01R 31/318541* (2013.01); *G01R 31/318558* (2013.01); *G01R 31/318572* (2013.01); *G01R 31/31701* (2013.01); *G11C 29/32* (2013.01)

(58) Field of Classification Search
CPC ................. G01R 31/31701; G01R 31/318572; G01R 31/318541; G01R 31/318555; G01R 31/318547; G01R 31/318558; G01R 31/318533; G11C 29/12015; G11C 29/32

USPC .......................................... 714/727, 729, 733
See application file for complete search history.

(56) References Cited

U.S. PATENT DOCUMENTS

| 4,875,003 | A  | * | 10/1989 | Burke ........................... 714/736 |
|-----------|----|---|---------|------------------------------------------|
| 6,266,793 | B1 | * | 7/2001  | Mozdzen et al. .............. 714/727   |
| 6,304,099 | B1 | * | 10/2001 | Tang et al. ....................... 326/38 |
| 6,314,539 | B1 | * | 11/2001 | Jacobson et al. .............. 714/727  |
| 6,430,718 | B1 | * | 8/2002  | Nayak ........................... 714/727 |
| 7,352,169 | B2 | * | 4/2008  | Abraham et al. ........ 324/762.02      |
| 7,487,419 | B2 | * | 2/2009  | Mukherjee et al. ........... 714/729    |
| 8,645,777 | B2 | * | 2/2014  | Zimmerman .................. 714/724    |
| 8,671,326 | B1 | * | 3/2014  | Tang et al. ..................... 714/758 |

FOREIGN PATENT DOCUMENTS

| KR | 1020020078884 A | 10/2002 |
|----|------------------|---------|
| KR | 1020070055850 A | 5/2007  |

* cited by examiner

*Primary Examiner* — James C Kerveros
(74) *Attorney, Agent, or Firm* — William Park & Associates Ltd.

(57) ABSTRACT

A semiconductor apparatus includes: a receiver configured to receive a plurality of input signals through a plurality of pads; a signal processing unit configured to process the input signals received by the receiver and output the processed signals as a plurality of internal signals; a MUX unit configured to select the plurality of internal signals as a plurality of MUX output or select test input data and a plurality of latch signals as the plurality of MUX output signals in response to an input/output select signal; a latch unit configured to output the plurality of MUX output signals as the plurality of latch signals and a final output signal in response to a latch clock signal; and a clock selection unit configured to output any one of a test clock signal and an internal clock signal as the latch clock signal in response to a test mode signal.

18 Claims, 4 Drawing Sheets

SEMICONDUCTOR APPARATUS WITH BOUNDARY SCAN TEST CIRCUIT

CROSS-REFERENCES TO RELATED APPLICATION

The present application claims priority under 35 U.S.C. §119(a) to Korean application number 10-2012-0151783 filed on Dec. 24, 2012 in the Korean Intellectual Property Office, which is incorporated herein by reference in its entirety.

BACKGROUND

1. Technical Field

Various embodiments generally relate to a semiconductor apparatus, and more particularly, to a boundary scan test of a semiconductor apparatus.

2. Related Art

According to the recent semiconductor integrated circuit technology, a memory and a controller are physically integrated into one chip, in order to reduce noise and uncertainty which may occur during signal transmission between the memory and the controller. Examples of an integrated circuit that integrates various electronic circuit blocks having different kinds into a single chip may include a system on a chip (SoC), a system in package (SiP) and the like. The market for SoC or SiP has been gradually expanded, because SoC or SiP may effectively reduce a chip area and may implement a high integration degree.

The semiconductor memory system may include a processor 2000 and a memory 3000 which are mounted over a substrate 1000. Each of the substrate 1000, the processor 2000, and the memory 3000 may include a plurality of connection terminals T to transmit and receive signals. When a packaging process for the semiconductor memory system is completed, the semiconductor memory system may communicate with an external device only through exposed pads PAD.

That is, after the semiconductor memory system is packaged, the semiconductor memory system has no connection paths through which the memory can be individually accessed, because the semiconductor memory system was molded by a package molding elements. Therefore, it is impossible to directly perform a probe test on the memory. Accordingly, a test method has been adopted, in which a test circuit is inserted into the memory 3000 and a test result by the test circuit is checked through a test pad of the substrate 1000.

Examples of the test circuit may include a boundary scan test circuit. The boundary scan test circuit is a test circuit designed to verify a signal input path between the processor 2000 and the memory 3000. The boundary scan test circuit may be formed in the memory 3000. Through a boundary scan test, it is possible to check a connection state between the processor 2000 and the memory 3000. However, the boundary scan test circuit has a disadvantage of occupying a large area within the memory 3000.

SUMMARY

In an embodiment, a semiconductor apparatus includes: a receiver configured to receive a plurality of input signals through a plurality of pads, respectively; a signal processing unit configured to process the plurality of input signals received by the receiver and output the processed signals as a plurality of internal signals, respectively; a multiplexer (MUX) unit configured to select the plurality of internal signals as a plurality of MUX output or select test input data and a plurality of latch signals as the plurality of MUX output signals in response to an input/output select signal; a latch unit configured to output the plurality of MUX output signals as the plurality of latch signals and a final output signal in response to a latch clock signal; and a clock selection unit configured to output any one of a test clock signal and an internal clock signal as the latch clock signal in response to a test mode signal.

In an embodiment, a semiconductor apparatus includes: a receiver configured to receive a plurality of input signals through a plurality of pads, respectively; a MUX unit configured to select the plurality of input signals received by the receiver as a plurality of MUX output signals or select test input data and a plurality of latch signals as the plurality of MUX output signals in response to an input/output select signal; a signal processing unit configured to process the plurality of MUX output signals and output the processed signals as a plurality of internal signals, respectively; a latch unit configured to output the plurality of internal signals as the plurality of latch signals and a final output signal in response to a latch clock signal; and a clock selection unit configured to output any one of a test clock signal and an internal clock signal as the latch clock signal in response to a test mode signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through exemplary embodiments.

Figure 1:
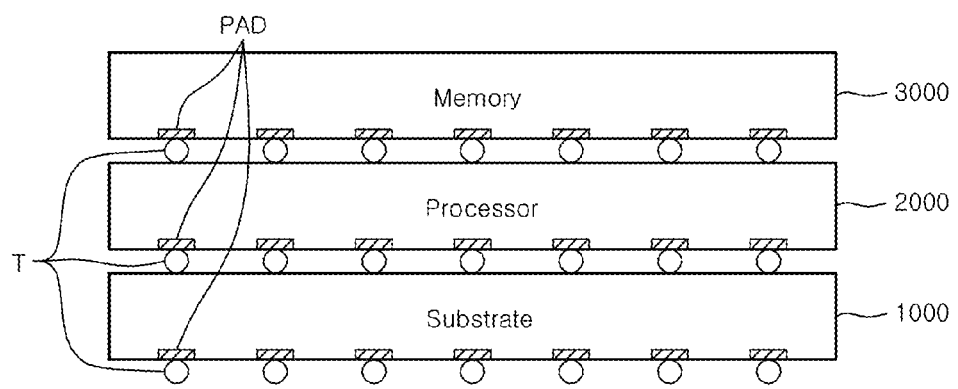
FIG. 1 is a cross-section view of a conventional semiconductor memory system.
Figure 2:
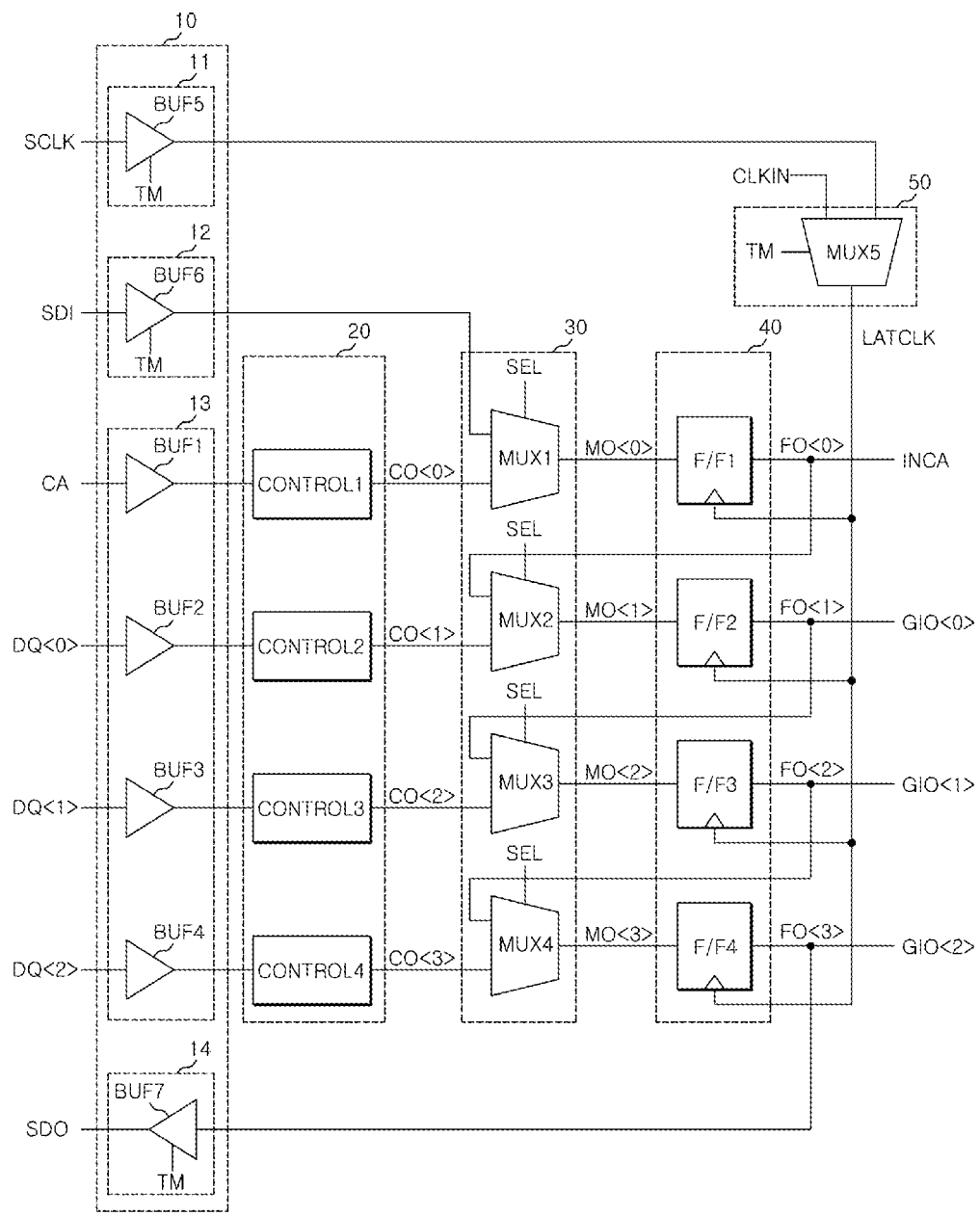
FIG. 2 is a circuit diagram of a semiconductor apparatus according to embodiment of the present invention.

Referring to FIG. 2. a semiconductor apparatus for performing a boundary scan test may include a transmitting and receiving unit 10, a signal processing unit 20, a multiplexer (MUX) unit 30, a latch unit 40, and a clock selection unit 50.

The transmitting and receiving unit 10 may include a test clock receiver 11, a test data receiver 12, a receiver 13, and a test data transmitter 14.

The test clock receiver 11 may be configured to receive a test clock signal SCLK through a test clock input pad (not shown) in response to a test mode signal TM.

The test data receiver 12 may be configured to receive test input data SDI through a test data input pad (not shown) in response to the test mode signal TM.

The receiver 13 may be configured to receive a plurality of input signals CA and DQ<0> to DQ<2> applied through a plurality of data pads (not shown), respectively. For example, the plurality of input signals CA and DQ<0> to DQ<2> may include a command signal, an address signal CA, or input data DQ<0> to DQ<2>.

The test data transmitter 14 may be configured to output a final output signal FO<3> of the semiconductor apparatus as test output data SDO to a test data output pad (not shown) in response to the test mode signal TM.

The test clock receiver 11, the test data receiver 12, the receiver 13, and the test data transmitter 14 may be configured as buffers BUF1 to BUF7.

The signal processing unit 20 may be configured to process the buffered plurality of input signals CA and DQ<0> to DQ<2> provided from the receiver 10 and output the processed signals as a plurality of internal signals CO<0> to C0<3>.

Specifically, the signal processing unit 20 may include a plurality of controllers CONTROL1 to CONTROL4. The first to fourth controllers CONTROL1 to CONTROL4 may be configured to receive the corresponding input signals CA and DQ<0> to DQ<2>, process the received signals in a predetermined manner, and output the processed signals as the first and fourth internal signals CO<0> to CO<3>, respectively. When the input signals CA and DQ<0> to DQ<2> are command signals, the controllers CONTROL1 to CONTROL4 may include command decoders (not shown). When the input signals CA and DQ<0> to DQ<2> are address signals, the controllers CONTROL1 to CONTROL4 may include address decoders (not shown). Furthermore, when the input signals CA and DQ<0> to DQ<2> are input data, the controllers CONTROL1 to CONTROL4 may include data alignment units (not shown).

The MUX unit 30 may be configured to select the plurality of internal signals CO<0> to CO<3> as a plurality of MUX output signals MO<0> and MO<3> in response to an input/output select signal SEL, or select the test input data SDI and the plurality of latch signals FO<0> and FO<2> as the plurality of MUX output signals MO<0> and MO<3>, respectively. For example, the Mux unit 30 may be configured to include a plurality of MUXes MUX 1 to MUX 4. The MUXes MUX 1 to MUX4 are configured to receive the plurality of internal signals CO<0> to CO<3> through first input terminals, respectively. Further, the MUXes MUX 1 to MUX4 are configured to receive the test input data SDI and the plurality of latch signals FO<0> and FO<2> through second input terminals, respectively. Thus, the MUXes MUX1 to MUX 4 may selectively output the plurality of internal signals CO<0> to CO<3> provided from the first input terminals or output the test input data SDI and the plurality of latch signals FO<0> and FO<2> provided form the second input terminals, according to the input/output select signal SEL.

The input/output select signal SEL may be a decision signal for selecting a data input mode or a data output mode. During a boundary scan test, a parallel in mode, for example, a data input mode using a parallel test is first performed, and a serial out mode, for example, a data output mode using a serial mode is then performed. During the parallel in mode, a plurality of pads of the semiconductor apparatus are used to collectively receive and latch input signals, and during the serial out mode, the latched signals are outputted serially through a test output pad.

Suppose that when the test mode signal TM is deactivated, that is, when the semiconductor apparatus performs a normal operation, the input/output select signal SEL has a first level. When the test mode signal TM is activated, that is, when the semiconductor apparatus performs a boundary scan test, the input/output select signal SEL first maintains the first level to perform the parallel in mode. Then, when the input signals are completely latched after a predetermined time passes, the input/output select signal SEL transits to a second level such that the semiconductor apparatus enters the serial out mode.

The MUX unit 30 may include a plurality of MUXes to MUX4.

The first MUX MUX1 may be configured to output any one of the test input data SDI and the first internal signal CO<0> as the first MUX output signal MO<0> in response to the input/output select signal SEL. That is, when the input/output select signal SEL with the first level is applied to the first MUX MUX1, the first MUX MUX1 may output the first internal signal CO<0> as the first MUX output signal MO<0>. When the input/output select signal SEL with the second level is applied to the first MUX MUX1, the first MUX MUX1 may output the test input data SDI as the first MUX output signal MO<0>.

The second MUX MUX2 may be configured to output any one of the first latch signal FO<0> and the second internal signal CO<1> as the second MUX output signal MO<1> in response to the input/output select signal SEL. That is, when the input/output select signal SEL with the first level is applied to the second MUX MUX2, the second MUX MUX2 may output the second internal signal CO<1> as the second MUX output signal MO<1>. When the input/output select signal SEL with the second level is applied to the second MUX MUX2, the second MUX MUX2 may output the first latch signal FO<0> as the second MUX output signal MO<1>.

The third MUX MUX3 may be configured to output any one of the second latch signal FO<1> and the third internal signal CO<2> as the third MUX output signal MO<2> in response to the input/output select signal SEL. That is, when the input/output select signal SEL with the first level is applied to the third MUX MUX3, the third MUX MUX3 may output the third internal signal CO<2> as the third MUX output signal MO<2>. When the input/output select signal SEL with the second level is applied, the third MUX MUX3 may output the second latch signal FO<1> as the third MUX output signal MO<2>.

The fourth MUX MUX4 may be configured to output any one of the third latch signal FO<2> and the fourth internal signal CO<3> as the fourth MUX output signal MO<3> in response to the input/output select signal SEL. That is, when the input/output select signal SEL with the first level is applied to the fourth MUX MUX4, the fourth MUX MUX4 may output the fourth internal signal CO<3> as the fourth MUX output signal MO<3>. When the input/output select signal SEL with the second-level is applied to the fourth MUX MUX4, the fourth MUX MUX4 may output the third latch signal FO<2> as the fourth MUX output signal MO<3>.

The latch unit 40 may be configured to output the plurality of MUX output signals MO<0> to MO<3> as the plurality of latch signals FO<0> to FO<2> and the final output signal FO<3> in response to a latch clock signal LATCLK.

The latch unit 40 may include a plurality of flip-flops F/F1 to F/F4.

The first flip-flop F/F1 may be configured to output the first MUX output signal MO<0> as the first latch signal FO<0> in synchronization with the latch clock signal LATCLK.

The second flip-flop F/F2 may be configured to output the second MUX output signal MO<1> as the second latch signal FO<1> in synchronization with the latch clock signal LATCLK.

The third flip-flop F/F3 may be configured to output the third MUX output signal MO<2> as the third latch signal FO<2> in synchronization with the latch clock signal LATCLK.

The fourth flip-flop F/F4 may be configured to output the fourth MUX output signal MO<3> as the final output signal FO<3> in synchronization with the latch clock signal LATCLK.

Therefore, during a normal mode, the first to fourth flip-flops F/F1 to F/F4 may latch the input signals CA and DQ<0> to DQ<2> inputted through the plurality of pads (not shown), respectively.

During a test mode, the first to fourth flip-flops F/F1 to F/F4 first may latch the input signals CA and DQ<0> to DQ<2> concurrently inputted through the plurality of pads, respectively, using the parallel in mode. Then each of the first to fourth flip-flops F/F1 to F/F4 may output the first to final output signal FO<0> to FO<3> using the serial output mode.

For example, when the latch unit 40 may be configured of n flip-flop, an output of the n-th flip-flop becomes the final output signal FO<3>. As the final output signal FO<3> is checked as the test output data SDO from an external device, the connection state of the semiconductor apparatus may be verified. More specifically, whether or not the data inputted in the parallel in mode may be sequentially outputted as the test output data SDO may be determined to verify the connection state of the semiconductor apparatus.

The clock selection unit 50 may be configured to output any one of the test clock signal SCLK buffered by the 5th buffer 11 and an internal clock signal CLKIN as the latch clock signal LATCLK in response to the test mode signal TM.

That is, during a normal operation, the clock selection unit 50 may provide the internal clock signal CLKIN as the latch clock signal LATCLK, and during a test operation, the clock selection unit 50 may provide the test clock signal SCLK as the latch clock signal LATCLK.

During the normal operation, signals latched by the latch clock signal LATCLK may be applied to internal circuit blocks through data lines INCA and GIO<0> to GIO<3>.

Figure 3:
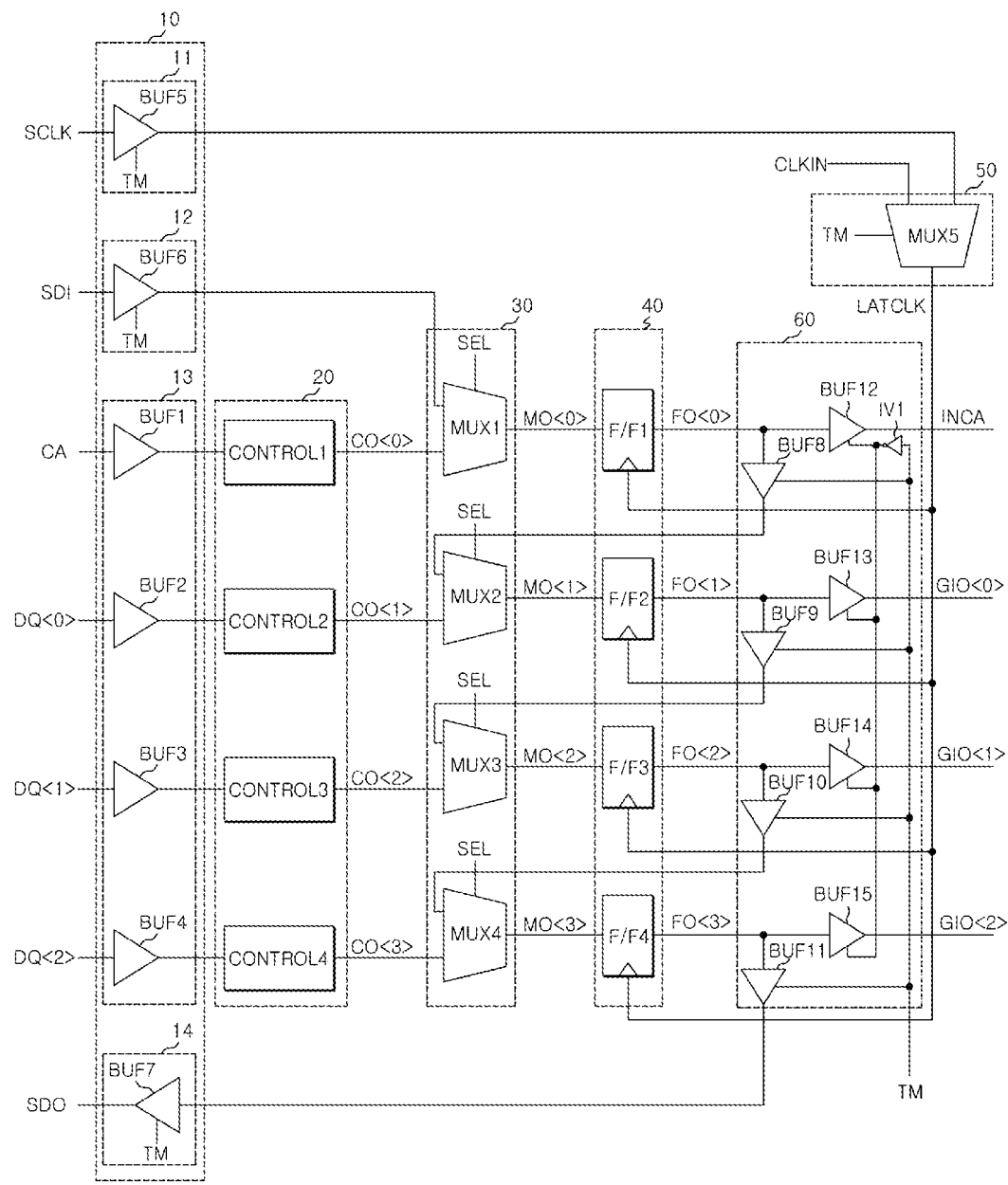
FIG. 3 is a circuit diagram of a semiconductor apparatus according to an embodiment of the present invention.

Referring to FIG. 3, a semiconductor apparatus may include a transmitting and receiving unit 10, a signal processing unit 20, a MUX unit 30, a latch unit 40, a clock selection unit 50, and a selection unit 60.

Furthermore, the components have the same characteristics as described with reference to FIG. 2. The semiconductor apparatus of FIG. 3 may further include a selection unit 60. The selection unit 60 may include 8th to 10th buffers BUF8 to BUF10 and an 11th buffer BUF11. The 8th to 10th buffers are configured to buffer the first to third latch signals FO<0> to FO<2> and provide the buffered signals to the 2nd to 4th MUXes MUX2 to MUX4. The 11th buffer BUF11 is configured to buffer the final output signal FO<3> and provide the buffered signal to the test data transmitter 140, during a test mode. In addition, the selection unit 60 may include 12th to 15th buffers BUF12 and BUF15 configured to buffer the first to third latch signals FO<0> to FO<2> and the final output signal FO<3> and provide the buffered signals to the data lines INCA and GIO<0> to GIO<3>, respectively, during a normal operation. The 8th to 11th buffers BUF8 to BUF11 may be enabled in response to the test mode signal TM, and the 12th to 15th buffers BUF12 to BUF15 may be enabled in response to the test mode signal TM inverted by a first inverter IV1.

Figure 4:
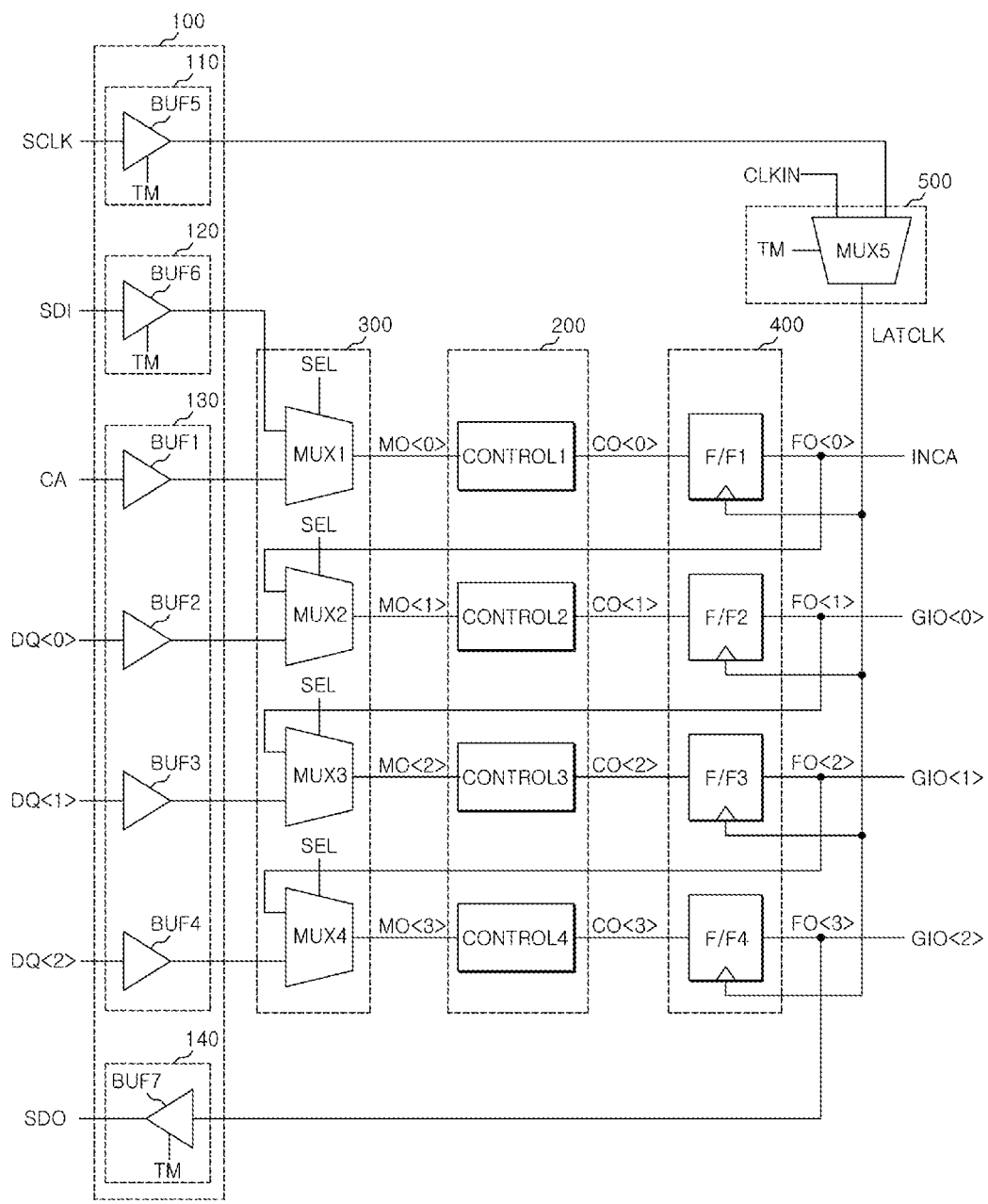
FIG. 4 is a circuit diagram of a semiconductor apparatus according to an embodiment of the present invention.

Referring to FIG. 4, the semiconductor apparatus of FIG. 4 may include a transmitting and receiving unit 100, a signal processing unit 200, a MUX unit 300, a latch unit 400, and a clock selection unit 500.

The transmitting and receiving unit 100 may include a test clock receiver 110, a test data receiver 120, a receiver 130, and a test data transmitter 140.

The test clock receiver 110 may be configured to receive a test clock signal SCLK through a test clock input pad (not shown) in response to a test mode signal TM.

The test data receiver 120 may be configured to receive test input data SDI through a test data input pad (not shown) in response to the test mode signal TM.

The receiver 130 may be configured to receive a plurality of input signals CA and DQ<0> to DQ<2> through a plurality of pads (not shown). For example, the plurality of input signals CA and DQ<0> to DQ<2> may include a command signal, an address signal CA, or input data DQ<0> to DQ<2>.

The test data transmitter 140 may be configured to output a final output signal FO<3> as the test output data SDO to a test data output pad (not shown) in response to the test mode signal TM.

The test clock receiver 110, the test data receiver 120, the receiver 130, and the test data transmitter 140 may be configured as buffers BUF1 to BUF7 to receive the respective signals.

The MUX unit 300 may be configured to select the plurality of input signals CA and DQ<0> to DQ<2> as a plurality of MUX output signals MO<0> to MO<3> in response to an input/output select signal SEL, or select test input data SDI and a plurality of latch signals FO<0> to FO<2> as the plurality of MUX output signals MO<0> to MO<3>, respectively.

The MUX MUX1 unit 300 may include a plurality of MUXes to MUX4.

The first MUX may be configured to output any one of the test input data SDI and the first input signal CA as the first MUX output signal MO<0> in response to the input/output select signal SEL. That is, when the input/output select signal SEL with the first level is applied to the first MUX MUX1, the first MUX MUX1 may output the buffered first input signal CA as the first MUX output signal MO<0>. When the input/output select signal SEL with the second level is applied to the first MUX MUX2, the first MUX MUX2 may output the test input data SDI as the first MUX output signal MO<0>.

The second MUX MUX2 may be configured to output any one of the first latch signal FO<0> and the buffered second input signal DQ<0> as the second MUX output signal MO<1> in response to the input/output select signal SEL. That is, when the input/output select signal SEL with the first level is applied to the second MUX MUX2, the second MUX MUX2 may output the second input signal DQ<0> as the second MUX output signal MO<1>. When the input/output select signal SEL with the second level is applied to the second MUX MUX2, the second MUX MUX2 may outputs the first latch signal FO<0> as the second MUX output signal MO<1>.

The third MUX MUX3 may be configured to output any one of the second latch signal FO<1> and the buffered third input signal DQ<1> as the third MUX output signal MO<2> in response to the input/output select signal SEL. When the input/output select signal SEL with the first level is applied to the third MUX MUX3, the third MUX MUX3 may output the third input signal DQ<1> as the third MUX output signal MO<2>. When the input/output select signal SEL with the second level is applied to third MUX MUX3, the third MUX MUX3 may output the second latch signal FO<1> as the third MUX output signal MO<2>.

The fourth MUX MUX4 may be configured to output any one of the third latch signal FO<2> and the buffered fourth input signal DQ<2> as the fourth MUX output signal MO<3> in response to the input/output select signal SEL. When the input/output select signal SEL with the first level is applied to the fourth MUX MUX4, the fourth MUX MUX4 may output the fourth input signal DQ<2> as the fourth MUX output signal MO<3>. When the input/output select signal SEL with the second level is applied to the fourth MUX MUX4, the fourth MUX MUX4 may output the third latch signal FO<2> as the fourth MUX output signal MO<3>.

The input/output select signal SEL may be a decision signal for selecting a data input mode or a data output mode. During a boundary scan test, a parallel in mode is first performed, and a serial out mode is then performed. During the parallel in mode, the plurality of pads of the semiconductor apparatus are used to collectively (concurrently) receive and latch input signals, and during the serial out mode, the latched signals are outputted serially through a test output pad.

Suppose that when the test mode signal TM is deactivated, that is, when the semiconductor apparatus performs a normal operation, the input/output select signal SEL has the first level. When the test mode signal TM is activated, that is, when the semiconductor apparatus performs a boundary scan test, the input/output select signal SEL first maintains the first level to perform the parallel in mode. Then, when the input signals are completely latched after a predetermined time passes, the input/output select signal SEL transits to a second level such that the semiconductor apparatus enters the serial out mode.

The signal processing unit 200 may be configured to process the plurality of MUX output signals MO<0> to MO<3> and output the processed signals as a plurality of internal signals CO<0> to CO<3>, respectively.

The signal processing unit 200 may include a plurality of controllers CONTROL1 to CONTROL4. The first to fourth controllers CONTROL1 to CONTROL4 may be configured to receive the corresponding MUX output signals MO<0> to MO<3>, process the received signals in a below manner, and output the processed signals as the first to fourth internal signals CO<0> to CO<3>, respectively.

When the input signals CA and DQ<0> to DQ<2> are command signals, the controllers CONTROL1 to CONTROL4 may include command decoders (not shown), and when the input signals CA and DQ<0> to DQ<2> are address signals, the controllers CONTROL1 to CONTROL4 may include address decoders (not shown). Furthermore, when the input signals CA and DQ<0> to DQ<2> are input data, the controllers CONTROL1 to CONTROL4 may include data alignment units.

The latch unit 400 may be configured to output the plurality of internal signals CO<0> to CO<3> as the plurality of latch signals FO<0> to FO<2> and the final output signal FO<3> in response to the latch clock signal LATCLK.

The latch unit 400 may include a plurality of flip-flops F/F1 to F/F4.

The first flip-flop F/F1 may be configured to output the first internal signal CO<0> as the first latch signal FO<0> in synchronization with the latch clock signal LATCLK.

The second flip-flop F/F2 may be configured to output the second internal signal CO<1> as the second latch signal FO<1> in synchronization with the latch clock signal LATCLK.

The third flip-flop F/F3 may be configured to output the third internal signal CO<2> as the third latch signal FO<2> in synchronization with the latch clock signal LATCLK.

The fourth flip-flop F/F4 may be configured to output the fourth internal signal CO<3> as the final output signal FO<3> in synchronization with the latch clock signal LATCLK.

Therefore, during the normal mode, the first to fourth flip-flops F/F1 to F/F4 may latch the input signals CA and DQ<0> to DQ<2> inputted through the plurality of pads (not illustrated), respectively. On the other hand, during the test mode, the first to fourth flip-flops F/F1 to F/F4 may latch the input signals CA and DQ<0> to DQ<2> inputted through the plurality of pads, respectively, in the parallel in mode. Then, each of the first to fourth flip-flops F/F1 to F/F4 may receive and latch an output of a flip-flop positioned at the previous stage thereof in the serial out mode. For example, when n flip-flops are provided, an output of the n-th flip-flop becomes the final output signal FO<3>. As the final output signal FO<3> is checked as the test output data SDO from outside, the connection state of the semiconductor apparatus may be verified. More specifically, whether or not the data inputted in the parallel in mode are sequentially outputted as the test output data SDO may be determined to verify the connection state of the semiconductor apparatus.

The clock selection unit 500 may be configured to output any one of the test clock signal SCLK and an internal clock signal CLKIN as the latch clock signal LATCLK in response to the test mode signal TM. That is, during the normal operation, the clock selection unit 500 may provide the internal clock signal CLKIN as the latch clock signal LATCLK. During the test operation, the clock selection unit 500 may provide the test clock signal SCLK as the latch clock signal LATCLK.

Although not illustrated, the semiconductor apparatus according to the embodiment may further include a selection unit (not illustrated) such as the selection unit 60 illustrated in FIG. 3. The selection unit may be provided between the data lines INCA and GIO<0> to GIO<3> and the MUXes MUX1 to MUX4 and configured to control the transmission of the first to third latch signals FO<0> to FO<2> and the final output signal FO<3> depending on whether the current mode is the test mode or not.

During the normal operation, the signals latched by the latch clock signal LATCLK may be applied to the inside through the respective data lines INCA and GIO<0> to GIO<3>.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a receiver configured to receive a plurality of input signals;
   a signal processing unit configured to process the plurality of input signals received by the receiver and output the processed signals as a plurality of internal signals, respectively;
   a multiplexer (MUX) unit configured to selectively output the plurality of internal signals or a test input data and a plurality of latch signals, as the plurality of MUX output signals, in response to an input/output select signal;
   a latch unit configured to output the plurality of MUX output signals as the plurality of latch signals and a final output signal in synchronization with a latch clock signal, respectively; and
   a clock selection unit configured to output any one of a test clock signal and an internal clock signal as the latch clock signal in response to a test mode signal,
   wherein the MUX unit comprises:
   a first MUX configured to receive a first internal signal and the test input data, and select one of the first internal signal and the test input data in response to the input/output select signal as a first MUX output signal,
   a second MUX configured to receive a second internal signal being different from the first internal signal and the first MUX output signal, and select one of the second internal signal and the first MUX output signal as a second MUX output signals, and a third MUX configured to receive a third internal signal being different from the first and second internal signals and the second MUX output signal, and select one of the third internal signal and the second MUX output signal as a third MUX output signals.

2. The semiconductor apparatus according to claim 1, further comprising:

a test clock receiver configured to receive the test clock signal in response to the test mode signal; and a test data receiver configured to receive the test input data in response to the test mode signal.

3. The semiconductor apparatus according to claim 1, further comprising a test data transmitter configured to output the final output signal as test output data in response to the test mode signal.

4. The semiconductor apparatus according to claim 3, further comprising a selection unit comprising:

a plurality of first buffers configured to provide the plurality of latch signals to the MUX unit and provide the final output signal to the test data transmitter, when the test mode signal is activated; and a plurality of second buffers configured to provide the plurality of latch signals and the final output signal to corresponding data lines, when the test mode signal is deactivated.

5. The semiconductor apparatus according to claim 1, wherein the plurality of input signals comprise a command signal, an address signal, and input data.

6. The semiconductor apparatus according to claim 1, wherein the signal processing unit comprises a plurality of controllers configured to process the respective input signals.

7. The semiconductor apparatus according to claim 6, wherein each of the controllers comprises a command decoder, an address decoder, or a data alignment unit.

8. The semiconductor apparatus according to claim 1, wherein when the test mode signal is deactivated, the input/output select signal maintains a first level, and when the test mode signal is activated, the input/output select signal transits from the first level to a second level.

9. The semiconductor apparatus according to claim 8, wherein the first MUX is configured to output the first internal signal as the first MUX output signal when the input/output select signal has the first level, and output the test input data as the first MUX output signal when the input/output select signal has the second level.

10. The semiconductor apparatus according to claim 8, wherein an n-th flip-flop of the latch unit is configured to receive an n-1 MUX output signals and output the final output signal.

11. A semiconductor apparatus comprising:

a receiver configured to receive a plurality of input signals, respectively;

a MUX unit configured to selectively output the plurality of input signals received by the receiver or a test input data and a plurality of latch signals, as the plurality of MUX output signals, in response to an input/output select signal;

a signal processing unit configured to process the plurality of MUX output signals and output the processed signals as a plurality of internal signals, respectively;

a latch unit configured to output the plurality of internal signals as the plurality of latch signals and a final output signal in response to a latch clock signal; and a clock selection unit configured to output any one of a test clock signal and an internal clock signal as the latch clock signal in response to a test mode signal, wherein the MUX unit comprises:

a first MUX configured to receive a first input signal and the test input data, and select one of the first input signal and the test input data in response to the input/output select signal as a first MUX output signal, a second MUX configured to receive a second input signal being different from the first input signal and a first latch signal and select one of the second input signal and the first latch signal in response to the input/output select signal as a second MUX output signal, and a third MUX configured to receive a third input signal being different from the first and second input signals and the second MUX output signal, and select one of the third input signal and the second MUX output signal as a third MUX output signals.

12. The semiconductor apparatus according to claim 11, further comprising:

a test clock receiver configured to receive the test clock signal in response to the test mode signal;

a test data receiver configured to receive the test input data in response to the test mode signal; and a test data transmitter configured to output the final output signal as test output data in response to the test mode signal.

13. The semiconductor apparatus according to claim 12, further comprising a selection unit comprising:

a plurality of first buffers configured to provide the plurality of latch signals to the MUX unit and provide the final output signal to the test data transmitter, when the test mode signal is activated; and a plurality of second buffers configured to provide the plurality of latch signals and the final output signal to corresponding data lines, when the test mode signal is deactivated.

14. The semiconductor apparatus according to claim 11, wherein when the test mode signal is deactivated, the input/output select signal maintains a first level, and when the test mode signal is activated, the input/output select signal transits from the first level to a second level.

15. The semiconductor apparatus according to claim 14, wherein the signal processing unit comprises a plurality of controllers, a first controller among the plurality of controllers is configured to process the first MUX output signal and output the processed signal as a first internal signal, the latch unit comprises a plurality of flip-flops, and a first flip-flop among the plurality of flip-flops is configured outputs the first internal signal as a first latch signal in synchronization with the latch clock signal.

16. The semiconductor apparatus according to claim 15, wherein the first MUX is configured to output the first input signal as the first MUX output signal when the input/output select signal has the first level, and outputs the test input data as the first MUX output signal when the input/output select signal has the second level.

17. The semiconductor apparatus according to claim 15, wherein a second controller among the plurality of controllers is configured to process the second MUX output signal and output the processed signal as a second internal signal, and the second flip-flop among the plurality of flip-flops is configured to output the second internal signal as a second latch signal in synchronization with the latch clock signal.

18. The semiconductor apparatus according to claim 15, wherein the latch unit is configured to output an output of an n-th flip-flop among the plurality of flip-flops as the final output signal.

* * * * *